United States Patent
Griebenow et al.

(10) Patent No.: US 8,026,134 B2
(45) Date of Patent: Sep. 27, 2011

(54) RECESSED DRAIN AND SOURCE AREAS IN COMBINATION WITH ADVANCED SILICIDE FORMATION IN TRANSISTORS

(75) Inventors: Uwe Griebenow, Markkleeberg (DE); Andy Wei, Dresden (DE); Jan Hoentschel, Dresden (DE); Thilo Scheiper, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/549,769

(22) Filed: Aug. 28, 2009

(65) Prior Publication Data

US 2010/0109091 A1 May 6, 2010

(30) Foreign Application Priority Data

Oct. 31, 2008 (DE) .................. 10 2008 054 075

(51) Int. Cl.
*H01L 21/8238* (2006.01)

(52) U.S. Cl. ................. 438/199; 257/E23.062

(58) Field of Classification Search ............ 257/369, 257/E23.062; 438/199, 585, 694
See application file for complete search history.

(56) References Cited

U.S. PATENT DOCUMENTS

| | | | |
|---|---|---|---|
| 6,323,094 B1 * | 11/2001 | Wu ................. | 438/303 |
| 6,597,046 B1 * | 7/2003 | Chau et al. ........... | 257/411 |
| 6,887,762 B1 | 5/2005 | Murthy et al. ......... | 438/300 |
| 7,012,007 B1 * | 3/2006 | Goo et al. ............ | 438/296 |
| 7,342,284 B2 * | 3/2008 | Ting et al. ........... | 257/369 |
| 7,396,718 B2 * | 7/2008 | Frohberg et al. ....... | 438/233 |
| 7,608,499 B2 * | 10/2009 | Romero et al. ........ | 438/199 |
| 7,696,052 B2 * | 4/2010 | Wei et al. ............ | 438/300 |
| 7,754,556 B2 * | 7/2010 | Feudel et al. ......... | 438/199 |
| 7,825,477 B2 * | 11/2010 | Hsiao et al. .......... | 257/369 |
| 2002/0053711 A1 | 5/2002 | Chau et al. ........... | 257/412 |
| 2004/0227185 A1 | 11/2004 | Matsumoto et al. ..... | 257/347 |
| 2005/0110082 A1 | 5/2005 | Cheng et al. ......... | 257/341 |
| 2007/0200179 A1 * | 8/2007 | Chen ................. | 257/369 |
| 2007/0221964 A1 | 9/2007 | Amos et al. .......... | 257/288 |
| 2007/0228482 A1 * | 10/2007 | Wei et al. ........... | 257/369 |
| 2007/0238242 A1 | 10/2007 | Ting et al. .......... | 438/230 |
| 2007/0254461 A1 | 11/2007 | Wei et al. ........... | 438/514 |
| 2008/0224226 A1 * | 9/2008 | Suzuki et al. ........ | 257/369 |
| 2009/0020820 A1 * | 1/2009 | Baik et al. .......... | 257/369 |
| 2009/0057769 A1 * | 3/2009 | Wei et al. ........... | 257/369 |
| 2009/0174002 A1 * | 7/2009 | Ouyang et al. ....... | 257/369 |
| 2009/0179278 A1 * | 7/2009 | Shima ............... | 257/369 |

(Continued)

OTHER PUBLICATIONS

Translation of Official Communication from German Patent Office for German Patent Application No. 10 2008 054 075.7 dated Aug. 13, 2009.

(Continued)

*Primary Examiner* — Nathan Ha
(74) *Attorney, Agent, or Firm* — Williams, Morgan & Amerson, P.C.

(57) ABSTRACT

During the manufacturing process for forming sophisticated transistor elements, the gate height may be reduced and a recessed drain and source configuration may be obtained in a common etch sequence prior to forming respective metal silicide regions. Since the corresponding sidewall spacer structure may be maintained during the etch sequence, controllability and uniformity of the silicidation process in the gate electrode may be enhanced, thereby obtaining a reduced degree of threshold variability. Furthermore, the recessed drain and source configuration may provide reduced overall series resistance and enhanced stress transfer efficiency.

18 Claims, 4 Drawing Sheets

U.S. PATENT DOCUMENTS

| | | | |
|---|---|---|---|
| 2009/0218633 A1* | 9/2009 | Hoentschel et al. | 257/369 |
| 2009/0309164 A1* | 12/2009 | Chen et al. | 257/369 |
| 2009/0321841 A1* | 12/2009 | Hoentschel et al. | 257/369 |
| 2010/0025771 A1* | 2/2010 | Hoentschel et al. | 257/369 |
| 2010/0052068 A1* | 3/2010 | Griebenow et al. | 257/369 |
| 2010/0155850 A1* | 6/2010 | Wei et al. | 257/369 |
| 2010/0187636 A1* | 7/2010 | Yang et al. | 257/369 |
| 2010/0193846 A1* | 8/2010 | Satoh | 257/255 |
| 2010/0219485 A1* | 9/2010 | Chong et al. | 257/369 |
| 2010/0237431 A1* | 9/2010 | Feudel et al. | 257/369 |

OTHER PUBLICATIONS

PCT Search Report from PCT/EP2009/007548 dated Apr. 6, 2010.
International Preliminary Report on Patentability from PCT/EP2009/007548 dated May 12, 2011.

* cited by examiner

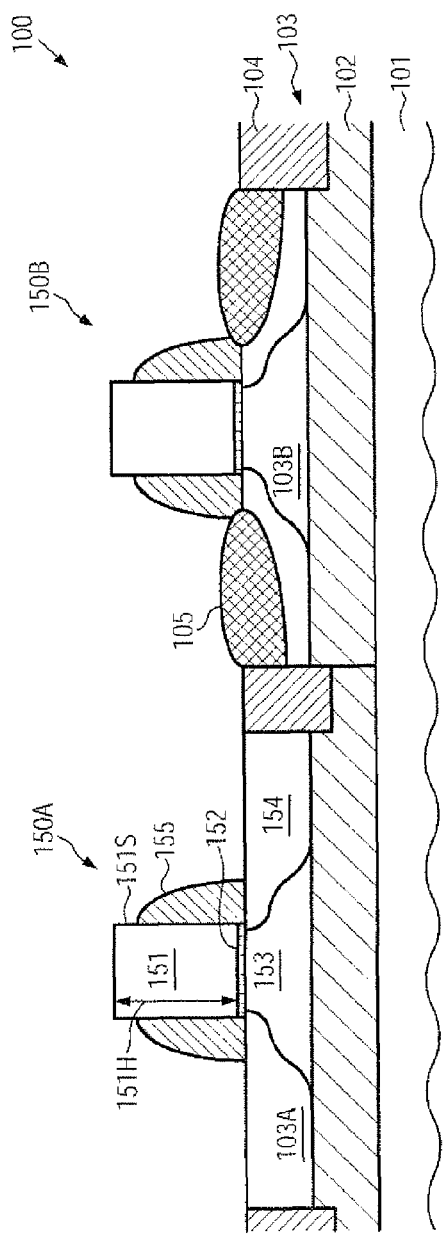
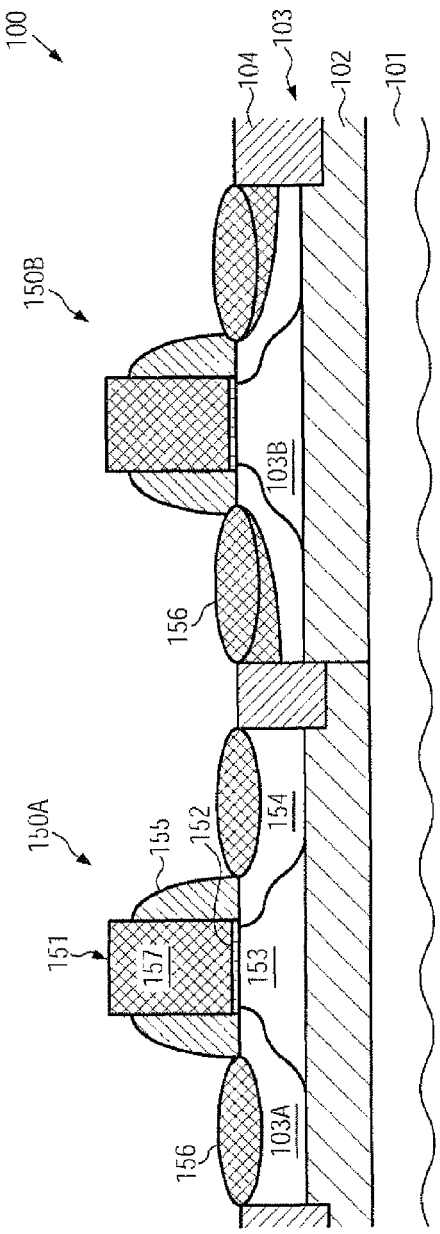
FIG. 1a (prior art)
FIG. 1b (prior art)

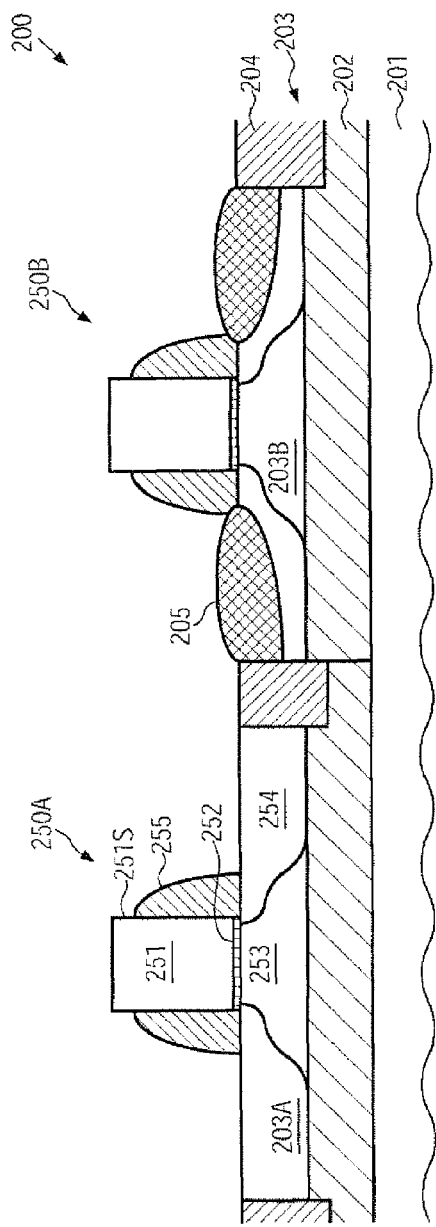
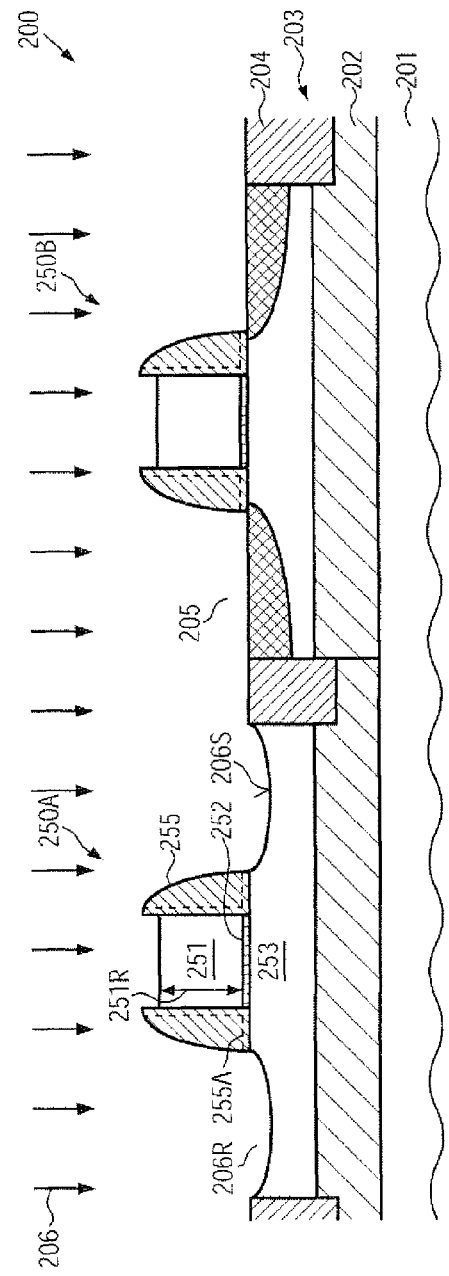

RECESSED DRAIN AND SOURCE AREAS IN COMBINATION WITH ADVANCED SILICIDE FORMATION IN TRANSISTORS

BACKGROUND OF THE INVENTION

1. Field of the Invention

Generally, the subject matter disclosed herein relates to integrated circuits, and, more particularly, to transistors having strained channel regions by using stress sources, such as stressed overlayers, a strained semiconductor alloy in drain and source areas to enhance charge carrier mobility in the channel region of a MOS transistor.

2. Description of the Related Art

Generally, a plurality of process technologies are currently practiced in the field of semiconductor production, wherein, for complex circuitry, such as microprocessors, complex storage chips and the like, CMOS technology is one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length is a dominant design criterion for accomplishing an increase in the operating speed and packing density of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is to provide low sheet and contact resistivity in drain and source regions and any contacts connected thereto and to maintain channel controllability. For example, reducing the channel length may necessitate an increase of the capacitive coupling between the gate electrode and the channel region, which may call for reduced thickness of the gate insulation layer. Presently, the thickness of silicon dioxide based gate insulation layers is in the range of 1-2 nm, wherein a further reduction may be less desirable in view of leakage currents which typically exponentially increase when reducing the gate dielectric thickness.

The continuous size reduction of the critical dimensions, i.e., the gate length of the transistors, necessitates the adaptation and possibly the new development of highly complex process techniques concerning the above-identified problems. It has, therefore, been proposed to improve transistor performance by enhancing the channel conductivity of the transistor elements by increasing the charge carrier mobility in the channel region for a given channel length, thereby offering the potential of achieving a performance improvement that is comparable with the advance to a future technology node, while avoiding or at least postponing many of the above-mentioned problems, such as gate dielectric scaling. One efficient mechanism for increasing the charge carrier mobility is the modification of the lattice structure in the channel region, for instance, by creating tensile or compressive stress in the vicinity of the channel region to produce a corresponding strain in the channel region, which results in a modified mobility for electrons and holes, respectively. For example, for standard silicon substrates, creating tensile strain in the channel region increases the mobility of electrons, which in turn may directly translate into a corresponding increase in the conductivity and thus drive current and operating speed. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

According to one promising approach for creating strain in the channel region of transistor elements, the dielectric material that is formed above the basic transistor structure may be provided in a highly stressed state so as to induce a desired type of strain at the transistor and in particular in the channel region thereof. For example, the transistor structures are typically enclosed by an interlayer dielectric material, which may provide the desired mechanical and electrical integrity of the individual transistor structures and which may provide a platform for the formation of additional wiring layers, which are typically required for providing the electrical interconnections between the individual circuit elements. That is, a plurality of wiring levels or metallization layers may typically be provided which may include horizontal metal lines and vertical vias including appropriate conductive materials for establishing the electrical connections. Consequently, an appropriate contact structure has to be provided which connects the actual circuit elements, such as transistors, capacitors and the like, or respective portions thereof, with the very first metallization layer. For this purpose, the interlayer dielectric material has to be appropriately patterned in order to provide respective openings connecting to the desired contact areas of the circuit elements, which may typically be accomplished by using an etch stop material in combination with the actual interlayer dielectric material.

For example, silicon dioxide is a well-established interlayer dielectric material, in combination with silicon nitride, which may act as an efficient etch stop material during the formation of the contact openings. Consequently, the etch stop material, i.e., the silicon nitride material, is in close contact with the basic transistor structure and thus may be efficiently used for inducing strain in the transistors, in particular as silicon nitride may be deposited on the basis of well-established plasma enhanced chemical vapor deposition (CVD) techniques with high internal stress. For instance, silicon nitride may be deposited with high internal compressive stress of up to 2 GPa and even higher by selecting appropriate deposition parameters. On the other hand, a moderately high internal tensile stress level may be created to 1 GPa and higher by appropriately adjusting the process parameters, for instance, in particular, the degree of ion bombardment during the deposition of the silicon nitride material. Consequently, the magnitude of the strain created in the channel region of a transistor element may depend on the internal stress level of the dielectric etch stop material and the thickness of stressed dielectric material, in combination with the effective offset of the highly stressed dielectric material with respect to the channel region. Consequently, in view of enhancing transistor performance, it may be desirable to increase the internal stress level and also provide enhanced amounts of highly stressed dielectric material in the vicinity of the transistor element, while also positioning the stressed dielectric material as closely as possible to the channel region. It turns out, however, that the internal stress levels of silicon nitride material may be restricted by the overall deposition capabilities of presently available plasma enhanced CVD techniques, while the effective layer thickness may also be substantially determined by the basic transistor topography and the distance between neighboring circuit elements. Consequently, although providing significant advantages, the efficiency of the stress transfer mechanism may significantly depend on process and device specifics and may result in reduced performance gain for well-established standard transistor designs having gate lengths of 50 nm and less, since the given device topography and the gap fill capabilities of the respective deposition process, in combination with a moderately high offset of the highly stressed material from the channel region caused by sophisticated spacer structures, may reduce the finally obtained strain in the channel region.

For these reasons, it has also been suggested to improve performance of transistors, such as P-channel transistors, by providing semiconductor materials, at least in portions of the drain and source areas, in such a manner that a desired type of strain may be generated in the adjacent channel region. For this purpose, frequently, a silicon/germanium mixture or alloy may be used, which may be grown by selective epitaxial growth techniques on a silicon template material, thereby creating a strained state of the silicon/germanium alloy, which may exert a certain stress on the adjacent channel region, thereby creating the desired type of strain therein. Consequently, in combination with an overlying stressed dielectric material, a highly efficient strain-inducing mechanism may be accomplished for P-channel transistors.

As previously discussed, in sophisticated transistor elements, a plurality of features finally determine the overall performance of the transistor, wherein a complex mutual interaction of these factors may be difficult to assess so that a wide variety of performance variations may be observed for a given basic transistor configuration. For example, the conductivity of doped silicon-based semiconductor regions may be increased by providing a metal silicide therein in order to reduce overall sheet resistance and contact resistivity. For example, the drain and source regions may receive a metal silicide, such as nickel silicide, nickel platinum silicide and the like, thereby reducing the overall series resistance of the conductive path between the drain and source terminals and the intermediate channel region. Similarly, a metal silicide may typically be formed in the gate electrode, which may comprise polysilicon material, thereby enhancing conductivity and thus reducing signal propagation delay. Although an increased amount of metal silicide in the gate electrode may per se be desirable in view of reducing the overall resistance thereof, a substantially complete silicidation of the polycrystalline silicon material down to the gate dielectric material may not be desirable in view of threshold voltage adjustment of the corresponding transistor element. It may, therefore, be desirable to maintain a certain portion of the doped polysilicon material in direct contact with the gate dielectric material to provide well-defined electronic characteristics in the channel region, so as to avoid significant threshold variations, which may be caused by a substantially full silicidation within portions of the gate electrode. Consequently, it may be difficult to provide a significant amount of metal silicide, while nevertheless reliably avoiding a complete silicidation of the polysilicon material.

Other characteristics of the gate electrode may also have an influence on the overall transistor performance. For example, for continuously decreasing feature sizes of the transistor elements, it would be desirable to also reduce the height of the gate electrode, which, however, may typically be limited due to required ion blocking capabilities during the generation of the drain and source dopant profiles by sophisticated implantation techniques. This required gate height, however, may result in an increased fringing capacitance with respect to contact elements, which may be formed so as to connect the drain and source regions. Consequently, the overall performance of complex transistor elements may be less pronounced than expected, even though corresponding performance increasing mechanisms, such as strained silicon/germanium material and the like, may be used, as will be described in more detail with reference to FIGS. 1a-1b.

FIG. 1a schematically illustrates a cross-sectional view of a semiconductor device 100 comprising a substrate 101, above which is formed a semiconductor layer 103, in which a plurality of isolation structures 104 may define active regions 103A, 103B of an N-channel transistor 150A and a P-channel transistor 150B, respectively. An active region is to be understood as a portion of the semiconductor layer 103 in which appropriate dopant profiles are to be established in order to obtain the desired transistor function. In the manufacturing stage shown, the transistors 150A, 150B comprise a gate electrode 151 that is formed on a gate insulation layer 152, which separates the gate electrode 151 from a channel region 153. Furthermore, a spacer structure 155 is formed on a portion of the sidewalls of the gate electrode 151, wherein it should be appreciated that the spacer structure 155 may have any appropriate configuration as is required for defining the dopant profile of corresponding drain and source regions 154. For example, the spacer structure 155 may comprise a plurality of individual spacer elements, possibly in combination with corresponding etch stop liners (not shown). As previously discussed, the P-channel transistor 150B comprises a silicon/germanium alloy 105, which may have a strained state so as to create a corresponding compressive strain component in the channel region 153 of the transistor 150B.

The semiconductor device 100 as shown in FIG. 1a may be formed on the basis of the following process sequence. After forming the isolation structures 104, for instance by lithography, etch, deposition and planarization techniques, the active regions 103A, 103B may be defined by established implantation techniques in combination with a corresponding masking regime. Thereafter, the gate electrodes 151, in combination with the gate insulation layers 152, may be formed, for instance, providing an appropriate dielectric material and depositing a polysilicon material, which may then be patterned on the basis of sophisticated lithography and etch techniques. As previously explained, a height 151H of the gate electrode 151 may typically be selected to provide a sufficient ion blocking effect during the subsequent processing of the device 100. Thereafter, the transistor 150A may be masked, for instance by a hard mask in combination with a resist mask, while also the gate electrode 151 of the transistor 150B may be encapsulated, for instance on the basis of appropriate cap layers and sidewalls spacers (not shown) in order to form corresponding cavities in the active region 103B and subsequently depositing the silicon/germanium alloy 105 on the basis of selective epitaxial growth techniques. Next, the mask layer may be removed and the gate electrodes 151 may be exposed and the further processing may be continued, for instance by forming offset spacer elements, if required, which may be used for a first implantation sequence for defining a first part of the drain and source regions 154. Thereafter, the spacer structure 155 is formed by depositing an appropriate layer stack, such as an etch stop liner, such as silicon dioxide followed by a silicon nitride material, which may be accomplished by well-established CVD techniques. Thereafter, the layer stack is patterned by an anisotropic etch process, during which silicon nitride material is preferably removed from horizontal portions, while typically reliably exposing the horizontal device areas and also a portion 151S of the sidewalls of the gate electrodes 151 are exposed during the corresponding etch process and during subsequent etch and cleaning processes. Next, further implantation sequences may be performed so as to obtain the desired dopant profile for the drain and source regions 154. Thereafter, appropriate anneal processes are performed in order to activate the dopants and also re-crystallize implantation-induced damage. Thereafter, the device 100 is prepared for performing a silicidation process, which may typically include corresponding cleaning processes, thereby even further exposing the sidewall portion 151S.

FIG. 1*b* schematically illustrates the semiconductor device 100 in a further advanced manufacturing stage in which metal silicide regions 156 are formed in a portion of the drain and source regions 154, while also metal silicide 157 is formed in the gate electrode 151. In sophisticated technologies, frequently, nickel and platinum may be used for obtaining the metal silicide 156, 157 wherein, due to the different diffusion behavior of the polycrystalline material in the gate electrode 151 and the crystalline material in the drain and source regions 154, a significantly different "conversion rate" may be obtained, wherein, in particular at the sidewall portion 151 S, metal may increasingly diffuse into the gate electrode 151, thereby resulting in an increased silicidation rate. Consequently, the metal silicide 157 may extend down to the gate insulation layer 152, at least locally within the gate electrode 151, thereby resulting in a corresponding threshold voltage variation since the work function of the metal silicide may differ from the corresponding work function of the correspondingly doped polysilicon material. After the silicidation process, the further processing may be continued, for instance by depositing strain-inducing material layers, for instance in the form of silicon nitride, which may be deposited with high compressive and tensile stress, depending on the deposition parameters used. For example, a tensile stressed silicon nitride material may be formed above the N-channel transistor 150A, while a compressively stressed silicon nitride material may be formed above the transistor 150B, thereby appropriately enhancing overall performance of these transistors due to the corresponding additional strain created in the channel regions 153. Thereafter, an interlayer dielectric material, such as silicon dioxide and the like, is deposited and patterned so as to obtain corresponding contact openings, which are subsequently filled with a conductive material, such as tungsten, thereby providing contact elements connecting to the gate electrodes 151 and the drain and source regions 154. As previously discussed, the contact elements extending to the drain and source regions 154 may define, together with the gate electrode 151 and the intermediate dielectric material, a corresponding parasitic capacitor, which may have an influence on the overall channel controllability, which is typically referred to as fringing capacitance. Consequently, although reduced device dimensions may be applied in combination with sophisticated strain-inducing mechanisms, the transistors 150A, 150B may suffer from a less pronounced performance gain due to a moderately high fringing capacitance, while a certain degree of threshold variability may also be observed.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices and techniques for fabricating the same, wherein enhanced transistor performance may be obtained for N-channel transistors and P-channel transistors on the basis of a recessed transistor configuration, at least for one type of transistor, while, additionally, a height of a gate electrode may be reduced in order to reduce the fringing capacitance between contact elements and the gate electrode. At the same time, the reduced height of the gate electrode may nevertheless result in enhanced controllability of a corresponding silicidation process, thereby significantly reducing the probability of completely siliciding the polysilicon gate electrode material, which may therefore result in reduced threshold variability. In some illustrative aspects disclosed herein, the reduction of the gate height and the recessing of drain and source regions of at least one transistor may be accomplished on the basis of a non-masked etch regime, thereby not unduly contributing to overall process complexity. On the other hand, in some illustrative embodiments disclosed herein, a semiconductor alloy may be provided in one type of transistor with an appropriate amount of excess height so as to allow a substantially planar transistor configuration even after recessing the drain and source areas of the other type of transistors. Due to the recessed drain and source configuration, the overall strain-inducing effect of a corresponding highly stressed dielectric material may be enhanced, since a stressed dielectric material may be positioned at a height level that corresponds to the channel region. Furthermore, an increased surface area for the silicidation process may be provided in the drain and source regions, thereby reducing the overall series resistance between the drain and source terminals.

One illustrative semiconductor device disclosed herein comprises drain and source regions of a first transistor formed in a semiconductor material, wherein the drain and source regions have a recessed surface portion that is positioned at a lower height level compared to a height level defined by a surface of a gate insulation layer of the first transistor. The semiconductor device further comprises a gate electrode formed on the gate insulation layer, which comprises a doped silicon material that is formed on the gate insulation layer and which comprises a metal silicide formed on the doped silicon material. Furthermore, a spacer structure is provided so as to have a height that is greater than a height of the gate electrode and metal silicide regions are formed in the drain and source regions.

One illustrative method disclosed herein comprises forming a spacer structure on sidewalls of a gate electrode of a transistor and exposing drain and source regions of the transistor and the gate electrode to an etch ambient so as to remove material at least from the gate electrode selectively to the spacer structure. The method further comprises forming a metal silicide material in the drain and source regions and the gate electrode after removing the material. Finally, the method comprises forming a strain-inducing layer above the gate electrode and the drain and source regions.

A further illustrative method disclosed herein comprises performing an etch process to remove material from a first gate electrode of a first transistor and a second gate electrode of a second transistor and from drain and source regions from the first and/or the second transistor while protecting sidewalls of the first and second gate electrodes by a spacer structure. Moreover, the method comprises forming a metal silicide in the first and second gate electrodes and the drain and source regions in the presence of the spacer structure, wherein the metal silicide terminates in a doped silicon material of the first and second gate electrodes.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b schematically illustrate cross-sectional views of a sophisticated semiconductor device including an N-channel transistor and a P-channel transistor during various manufacturing stages in forming a metal silicide and strain-inducing mechanisms, according to conventional strategies;

FIGS. 2a-2c schematically illustrate cross-sectional views of a semiconductor device including different types of transistors during various manufacturing stages, wherein a recessed drain and source configuration may be formed in combination with reducing a height of a gate electrode structure, according to illustrative embodiments;

Figure 2C:
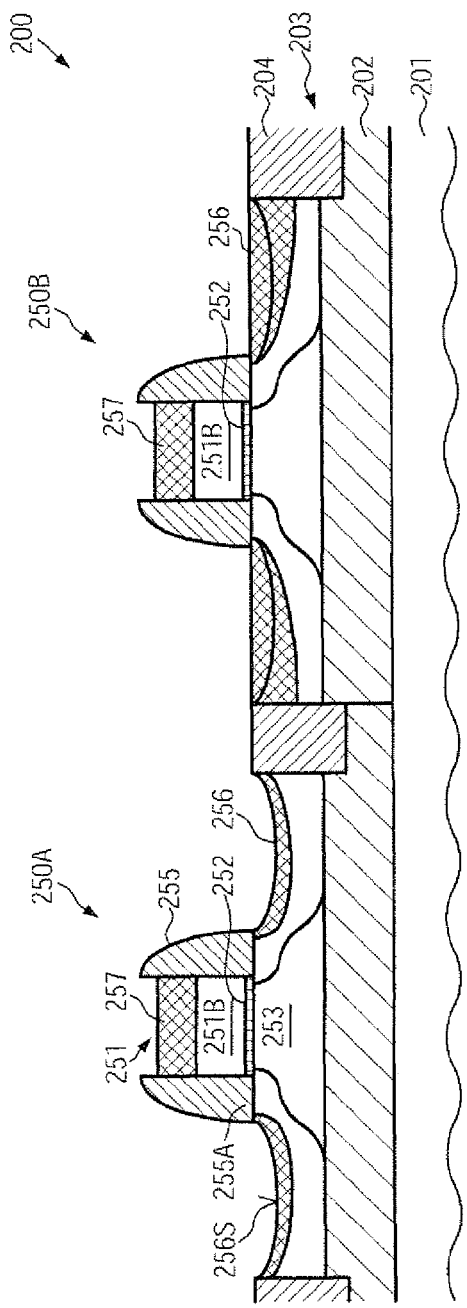

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to semiconductor devices and process techniques for providing a recessed transistor configuration, for instance in a selective manner, while at the same time enabling a reduction of the height of gate electrodes while nevertheless providing reduced threshold variability due to reducing the probability of creating fully silicided gate electrode structures. Due to the recessed drain and source configuration of, for instance, one type of device, such as an N-channel transistor, an enhanced surface topography may be provided for the subsequent deposition of a highly stressed dielectric material, such as a dielectric etch stop layer, an interlayer dielectric material and the like. That is, the recessed drain and source configuration may enable the positioning of the highly stressed dielectric material more closely to the channel region, even if a reduced layer thickness in other device regions may be required due to the restricted conformal deposition capabilities of the deposition process under consideration. Hence, the amount of dielectric material positioned closely to the channel region at a height level that substantially corresponds to the height level of the channel region may be increased which, in combination with the generally enhanced lateral stress transfer, may provide a higher strain in the adjacent channel region, thereby contributing to enhanced charge carrier mobility and thus drive current capability of the transistor under consideration. In addition, the recessed drain and source configuration may also provide an increased surface area that is available in a silicidation process, which may therefore result in a reduced sheet resistance of the contact areas of the transistor. At the same time, a substantially complete silicidation of the gate electrode may be suppressed, although a reduced height thereof may be created prior to the silicidation process so that, in total, any threshold variabilities may be reduced, while also the resulting fringing capacitance may be maintained at a reduced level compared to conventional strategies. On the other hand, the degree of recess, if any, in P-channel transistors may be adjusted on the basis of the amount of any excess material that may be formed in the drain and source areas in the form of a strain-inducing semiconductor alloy, thereby enabling an efficient reduction of gate height, wherein the finally obtained level of the drain and source areas may be adjusted on the basis of the previously provided excess material. Consequently, the strain-inducing effect of the semiconductor alloy may be substantially maintained, while at the same time the reduced gate height with the enhanced controllability of the metal silicide formation may also provide reduced transistor variability and a reduced fringing capacitance.

With reference to FIGS. 2a-2f, further illustrative embodiments will now be described in more detail, wherein reference may also be made to FIGS. 1a-1b, if appropriate.

FIG. 2a schematically illustrates a cross-sectional view of a semiconductor device 200, which may comprise a substrate 201 above which may be formed a semiconductor layer 203. The semiconductor layer 203 in combination with the substrate 201 may form, at least in some device areas of the device 200, an SOI configuration when a buried insulating layer 202 is provided. In other cases, the layer 202 as illustrated in FIG. 2a may represent a substantially crystalline material, such as an upper portion of the substrate 201. Furthermore, isolation structures 204, such as shallow trench isolations and the like, may define corresponding active regions 203A, 203B for transistors 250A, 250B, respectively. For example, the transistor 250A may represent an N-channel transistor while the transistor 250B may represent a P-channel transistor. In the manufacturing stage shown, the transistors 250A, 250B may comprise a gate electrode 251, a gate insulation layer 252 and a spacer structure 255 that is formed on a portion of the sidewalls of the gate electrode 251, thereby exposing an upper sidewall portion 251S. Furthermore, drain and source regions 254 may be formed in the active regions 203A, 203B, which may laterally enclose respective channel regions 253. In some illustrative embodiments, as shown in FIG. 2a, the transistor 250B may comprise a strain-inducing semiconductor alloy 205, such as a silicon/germanium alloy, a silicon/germanium/tin alloy, a silicon/tin alloy and the like, if a corresponding compressive strain is desired in the channel region 253.

The semiconductor device 200 may be formed on the basis of corresponding manufacturing techniques, as are also described with reference to the device 100. Thus, as previously explained, during corresponding etch and cleaning processes for preparing the semiconductor device 200 for receiving a metal silicide in the drain and source regions 254 and the gate electrode 251, the sidewall portion 251S may have been exposed, which conventionally may result in a certain degree of metal "wraparound" during the silicidation process, which may thus result in a moderately high diffusion rate and thus silicidation rate. Consequently, the increased silicidation rate may contribute to a corresponding variability of transistor characteristics, as previously explained.

FIG. 2b schematically illustrates the semiconductor device 200 in an advanced manufacturing stage. As illustrated, the device 200 is exposed to an etch ambient 206, which, in one illustrative embodiment, may be established as a plasma ambient on the basis of an appropriate etch chemistry to obtain a high degree of etch selectivity for silicon material with respect to silicon dioxide, silicon nitride and the like. For example, the spacer structure 255 may be comprised of a silicon nitride material according to well-established techniques, possibly in combination with a silicon dioxide-based etch stop liner 255A. In this case, well-established highly selective etch recipes may be used for establishing the process 206. For instance, similar process recipes may be used as are typically applied when patterning the gate electrode 251. Thus, during the etch process 206, material of the gate electrode 251 may be removed selectively to the spacer structure 255, while at the same time material of the drain and source regions 254 may be removed selectively with respect to the isolation structures 204 and the spacer structure 255. Consequently, corresponding recesses 206R are formed in the drain and source regions 254, at least at the transistor 250A, while in the transistor 250B, depending on the initial thickness of the semiconductor alloy 205, a substantially planar configuration may be obtained, as illustrated, while, in other cases, a certain degree of excess height may still be maintained or a recessing may be produced, however, with a less pronounced depth compared to the recesses 206R. The recesses 206R may be defined as device regions in which a surface 206S may have a portion, such as the center portion, the height level of which is positioned lower compared to a height level of the interface between the gate insulation layer 252 and the channel region 253. During the etch process 206, the initial height of the gate electrode 251 is also reduced so as to obtain a reduced gate height 251R, which may be selected such that the spacer structure 255 may extend above the gate electrode 251. Thus, the reduced gate height 251R allows for a reduced fringing capacitance with respect to contact elements still to be formed, while at the same time the surface area of the gate electrode 251 that may be available during a silicidation process may be restricted by the spacer structure 255, thereby also reducing the overall silicidation rate. Consequently, the etch process 206 may provide an enhanced surface topography for implementing an efficient strain-inducing mechanism, at least in the transistor 250A on the basis of a stressed dielectric material to be deposited in a later manufacturing stage, while also providing enhanced controllability of a silicidation process, wherein, additionally, the reduced height 251R provides enhanced transistor performance due to a reduced fringing capacitance. On the other hand, the process 206 may be performed as a non-masked process, thereby not unduly contributing to overall process complexity, for instance in terms of additional lithography steps and the like. The etch process 206 may comprise additional cleaning recipes, for instance on the basis of wet chemical etch processes, in order to prepare the exposed portions of the drain and source regions 254 and of the gate electrode 251 for the subsequent silicidation process.

FIG. 2c schematically illustrates the semiconductor device 200 in an advanced manufacturing stage. As shown, metal silicide regions 256, such as nickel/platinum silicide regions, are formed in the drain and source regions of the transistors 250A, 250B. Due to the recessing of the drain and source regions 254 of at least the transistor 250A, an increased surface area of the region 256 may be obtained compared to conventional configurations as, for instance, shown in FIG. 1b, thereby enhancing overall conductivity of the transistor 250A. Moreover, the metal silicide 256 may also define a recessed configuration, that is, at least a surface portion 256S may be positioned at a height level that is lower compared to a height level of the interface between the gate insulation layer 252 and the channel region 253.

In this context, it should be appreciated that any positional information is to be considered as relative position statements, wherein the substrate 201 is to be used as a reference. In this sense, the channel region 253 and the metal silicide regions 256 are formed "above" the substrate 201, wherein, however, the surface portion 256S is positioned "lower" compared to the interface between the channel region 253 and the gate insulation layer 252.

Moreover, the gate electrode 251 comprises a metal silicide region 257, which may be separated from the gate insulation layer 252 by a doped polysilicon material 251B. It should be appreciated that the degree of doping of the polysilicon materials 251B may be different in the transistors 250A, 250B, due to the preceding implantation processes for defining the corresponding drain and source regions 254. Consequently, the threshold characteristics of the respective transistors 250A, 250B may be determined by the correspondingly doped silicon regions 251B. Hence, although the overall height of the gate electrodes 251 may be reduced, nevertheless, a well-defined metal silicide portion, such as the region 257, may be formed while also maintaining a silicon-based material, such as the material 251B, to reduce the probability of substantially completely silicidizing the initial silicon-based gate electrode material, which may conventionally result in significant threshold variability.

The metal silicide regions 256 and 257 may be formed on the basis of well-established process techniques in which an appropriate refractory metal, such as nickel, platinum and the like, may be deposited and may be converted into a metal silicide by performing an appropriate heat treatment. Thereafter, any non-reacted metal material may be removed on the basis of well-established selective etch techniques, wherein additional heat treatments for stabilizing the overall characteristics may follow, if required. During the silicidation process, the spacer structure 255 may reliably cover the sidewalls of the gate electrode 251, thereby avoiding significant metal "wraparound" so that enhanced controllability and uniformity of the silicidation process may be accomplished. Consequently, a desired thickness of the metal silicide regions 257 may be obtained in a highly controllable manner.

Figure 2D:
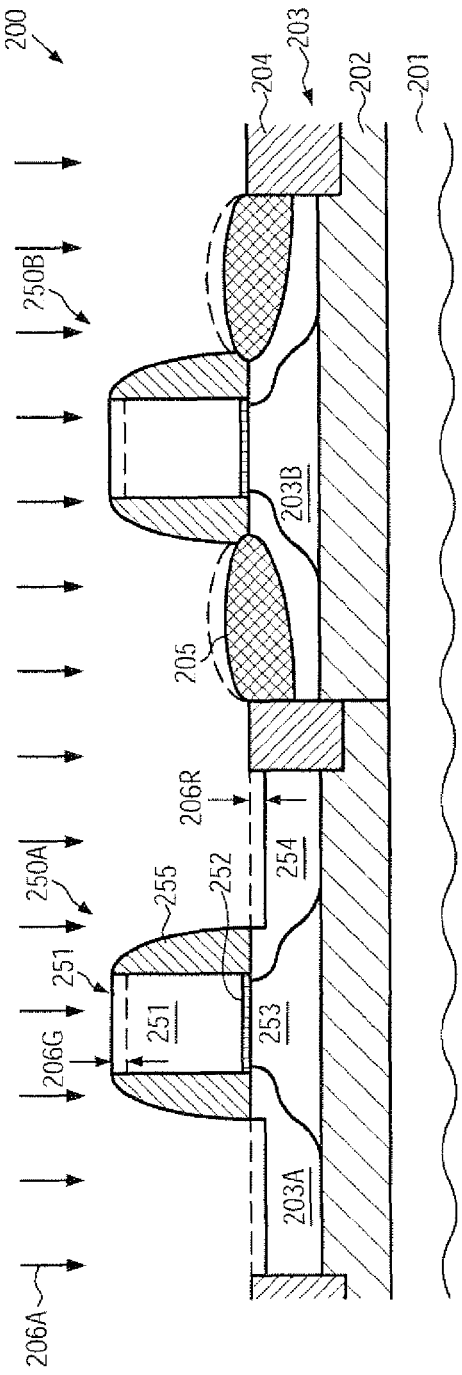
FIGS. 2d-2e schematically illustrate cross-sectional views of the semiconductor device according to further illustrative embodiments, in which recessing of drain and source regions and reducing the gate height may be decoupled to a certain degree.

FIG. 2d schematically illustrates the semiconductor device 200 according to further illustrative embodiments in which the degree of recessing of the drain and source regions 254 may be decoupled to a certain degree of reducing the height of the gate electrode 251. In one illustrative embodiment, in a manufacturing stage that substantially corresponds to the semiconductor device 200 as shown in FIG. 2a, an etch process 206A, such as a plasma-based etch process, may be performed to obtain a substantially anisotropic etch behavior in order to substantially define a desired degree of recessing 206R in the drain and source regions 254 of the transistor 250A, while sufficient excess material may be provided for the semiconductor alloy 205 in the transistor 250B when a significant degree of recessing is not desired for this transistor. For example, the etch process 206A may be performed on the basis of well-established highly selective etch recipes, as is also previously described. It should be appreciated that, depending on the desired degree of recessing 206R, a corresponding degree of recessing 206G may also be obtained in the gate electrode 251.

Figure 2E:
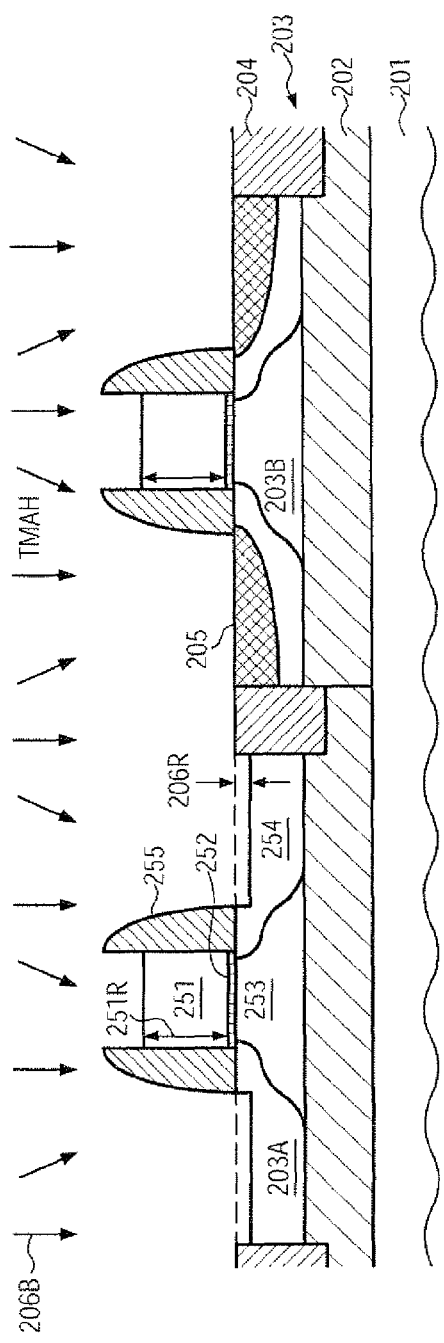

FIG. 2e schematically illustrates the semiconductor device 200 when exposed to a further etch ambient 206B, which may be designed as a selective wet chemical etch ambient in order to preferably remove material in the gate electrode 251, while substantially maintaining the desired degree of recessing 206R in the transistor 250A. For example, the etch ambient 206B may be established by using tetramethyl ammonium hydroxide (TMAH), which is a well-established material for etching exposed photoresist material. However, at higher concentrations and at elevated temperatures of approximately 50-80° C., TMAH may efficiently etch silicon material, wherein a high selectivity with respect to silicon oxide, silicon nitride and the like may be achieved. Furthermore, the etch rate of TMAH in crystalline silicon material having a high degree of N-doping may be significantly slowed down compared to polycrystalline silicon material. Consequently, the height of the gate electrode 251 may be efficiently reduced, while a significant increase of the recess 206R in the drain and source regions 254 of the transistor 250A may be avoided. On the other hand, the P-doped semiconductor alloy 205 may also be removed during the process 206B, wherein a previously provided excess height may be selected such that a desired degree of recessing or a substantially planar configuration or a reduced degree of excess height may be achieved in the transistor 250B. That is, during the corresponding selective epitaxial growth process for forming the semiconductor alloy 205, a corresponding excess amount of semiconductor alloy material may be provided so as to take into consideration the etch sequence comprising the process steps 206A and 206B in order to obtain the desired topography for the drain and source regions 254 of the transistor 250B. Consequently, on the basis of the etch process 206B, the final gate height 251R and the depth of the recess 206R may be substantially decoupled from each other so as to provide a further reduced fringing capacitance while not contributing to reduced reliability of a corresponding silicidation process for forming metal silicide regions in the drain and source areas 254 in view of shorting the corresponding PN junctions and the like. Thereafter, the further processing may be continued, as is previously described with reference to FIG. 2c.

Figure 2F:
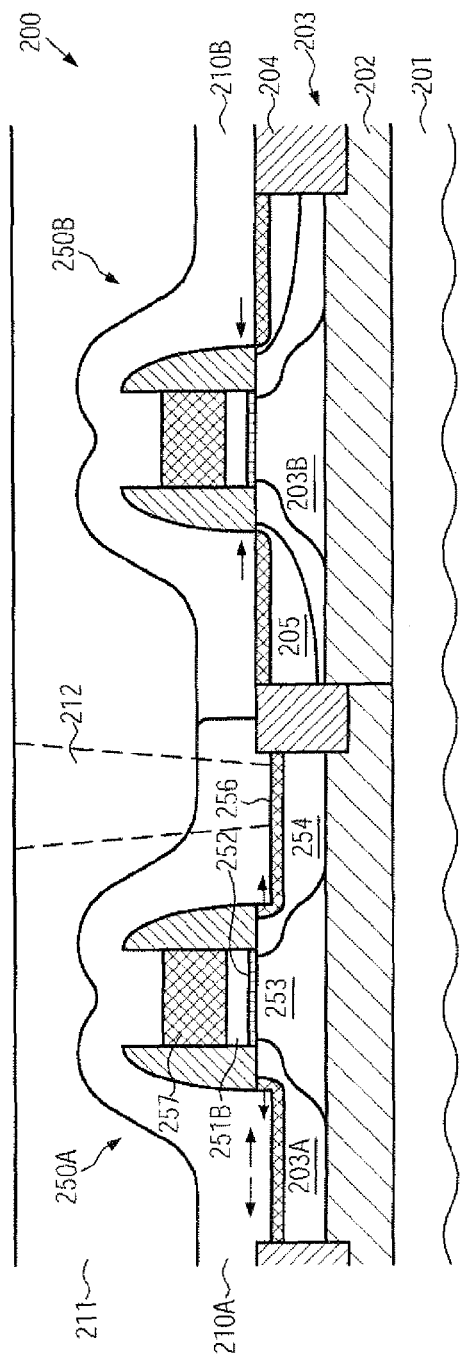
FIG. 2f schematically illustrates a cross-sectional view of the semiconductor device in a further advanced manufacturing stage, according to still further illustrative embodiments.

FIG. 2f schematically illustrates the semiconductor device 200 in a further advanced manufacturing stage. As illustrated, an interlayer dielectric material 211 is formed above the transistors 250A, 250B, for instance in the form of a silicon dioxide material, wherein a strain-inducing portion 210A for the transistor 250A and a strain-inducing portion 210B for the transistor 250B may also be provided. For example, as previously explained, the layers 210A, 210B may be provided as a silicon nitride material having a desired internal stress level so as to individually enhance performance of the transistors 250A, 250B, respectively. In the embodiment shown, the transistor 250A may represent an N-channel transistor and thus the layer 210A may be provided in the form of a tensile stressed material, possibly in combination with an etch stop material and the like, as may be required in accordance with corresponding process strategies. On the other hand, the layer 210B may be provided in the form of a compressively stressed silicon nitride material, or any other appropriate material, thereby enhancing performance of the transistor 250B. Thus, due to the recessed configuration of the drain and source regions 254 of at least the transistor 250A, the corresponding stress component may more efficiently act on the channel region 253, as previously explained, thereby providing higher strain levels in the channel region 253, even if in general a reduced thickness for the layer 210A may have to be used, for instance with respect to the overall packing density of the device 200 and the like. On the other hand, the transistor 250B may have the combined strain effect of the material 205 and the layer 210B. It should be appreciated, however, that any other configuration for the layers 210A, 210B may be used, depending on the overall device strategy. For instance, in some illustrative embodiments, the layers 210A, 210B may be provided with the same internal stress level, thereby significantly reducing overall process complexity. In this case, a high stress level, such as tensile stress, may be used in order to enhance performance of the transistor 250A, while a corresponding stress effect in the transistor 250B may be compensated for or overcompensated for by the material 205. In some illustrative embodiments, an excess height of the material 205 may be maintained during the preceding manufacturing processes, thereby further reducing the effect of the layer 210B. In other cases, a tensile stressed material may be deposited and may subsequently be selectively relaxed above the transistor 250B, for instance by ion implantation and the like.

Thereafter, the interlayer dielectric material 211 may be deposited and may be planarized in accordance with well-established process techniques. Next, corresponding lithography and etch processes may be performed to obtain corresponding contact openings, in which are to be formed contact elements 212, indicated as dashed lines. For this purpose, well-established process techniques may be applied. Consequently, the corresponding contact elements 212 may produce a reduced fringing capacitance with a gate electrode 251 due to the reduced height thereof, while nevertheless the portion 251B may provide a well-defined threshold behavior of the transistors 250A, 250B.

As a result, the present disclosure provides semiconductor devices and techniques for forming the same in which a plurality of performance enhancing mechanisms may be implemented, while avoiding or at least significantly reducing any combined negative effects. That is, a recessed drain and source configuration may be accomplished without unduly adding to process complexity, while a reduction of gate height may also be accomplished during the same etch sequence. On the other hand, the reduction in gate height during recessing of the drain and source regions results in enhanced process uniformity and reliability of the subsequent silicidation process. Consequently, reduced fringing capacitance in combination with reduced threshold variability and enhanced transistor performance due to the recessed drain and source configuration may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a spacer structure on sidewalls of a gate electrode of a transistor;
    exposing drain and source regions of said transistor and said gate electrode to an etch ambient to remove material at least from said gate electrode selectively to said spacer structure;
    forming a metal silicide material in said drain and source regions and said gate electrode after removing said material; and
    forming a strain-inducing layer above said gate electrode and said drain and source regions.

2. The method of claim 1, wherein exposing said drain and source regions and said gate electrode to said etch ambient further comprises removing material of said drain and source regions so as to form a recessed drain and source configuration.

3. The method of claim 1, wherein exposing said drain and source regions and said gate electrode to said etch ambient further comprises establishing said etch ambient on the basis of a plasma ambient.

4. The method of claim 1, wherein exposing said drain and source regions and said gate electrode to said etch ambient further comprises establishing said etch ambient on the basis of a wet chemical recipe.

5. The method of claim 4, wherein said wet chemical etch recipe comprises TMAH (tetra methyl ammonium hydroxide).

6. The method of claim 5, further comprising performing at least one further etch process using a different etch recipe.

7. The method of claim 1, further comprising forming a semiconductor alloy in drain and source areas of a second transistor prior to forming said spacer structure.

8. The method of claim 7, wherein said semiconductor alloy is formed with an excess height so as to determine a target height level of drain and source regions of said second transistor after exposing said drain and source regions and said gate electrode of said first transistor and said drain and source regions and a gate electrode of said second transistor to said etch ambient.

9. The method of claim 8, wherein said target height level corresponds to a substantially non-recessed drain and source configuration.

10. The method of claim 1, further comprising forming a strain-inducing dielectric layer above said gate electrode structure and said drain and source regions.

11. The method of claim 1, wherein said metal silicide is formed so as to not extend to a gate insulation layer of said gate electrode structure.

12. A method, comprising:
    performing an etch process to remove material from a first gate electrode of a first transistor and a second gate electrode of a second transistor and drain and source regions of at least one of said first and second transistors while protecting sidewalls of said first and second gate electrodes by a spacer structure; and
    forming a metal silicide in said first and second gate electrodes and said drain and source regions in the presence of said spacer structure, said metal silicide terminating in a doped silicon material of said first and second gate electrodes.

13. The method of claim 12, wherein said etch process is performed on the basis of a plasma ambient.

14. The method of claim 12, wherein performing said etch process comprises performing a wet chemical etch process.

15. The method of claim 14, wherein said wet chemical etch process is performed on the basis of TMAH (tetra methyl ammonium hydroxide).

16. The method of claim 12, further comprising forming a semiconductor alloy in said drain and source regions of said second transistor prior to performing said etch process, wherein an excess material of said semiconductor alloy is provided so as to maintain a substantially non-recessed drain and source configuration in said second transistor.

17. The method of claim 12, further comprising forming a first strain-inducing dielectric layer above said first transistor and a second strain-inducing dielectric layer above said second transistor.

18. The method of claim 17, wherein said etch process is performed so as to produce a recessed drain and source configuration in said first transistor.

* * * * *